United States Patent
Nagai et al.

(10) Patent No.: US 9,398,736 B2
(45) Date of Patent: Jul. 19, 2016

(54) ELECTRONIC COMPONENT MOUNTING APPARATUS AND THE SAME METHOD THEREOF

(71) Applicant: Shinkawa Ltd., Tokyo (JP)

(72) Inventors: Satoru Nagai, Tokyo (JP); Yukitaka Sonoda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 13/728,004

(22) Filed: Dec. 27, 2012

(65) Prior Publication Data
US 2013/0181037 A1 Jul. 18, 2013

Related U.S. Application Data

(63) Continuation of application No. PCT/JP2011/064625, filed on Jun. 27, 2011.

(30) Foreign Application Priority Data

Jun. 30, 2010 (JP) ................................. 2010-149107

(51) Int. Cl.
*B23K 31/02* (2006.01)
*H05K 13/04* (2006.01)
*H01L 23/00* (2006.01)

(52) U.S. Cl.
CPC ............ *H05K 13/0465* (2013.01); *H01L 24/75* (2013.01); *H01L 24/81* (2013.01); *H01L 24/04* (2013.01); *H01L 24/13* (2013.01);
(Continued)

(58) Field of Classification Search
CPC .............. B23K 1/00; B23K 3/00; B23K 3/04; B23K 3/087; B23K 3/0478; H01L 2021/00; H01L 2021/70

USPC ........................................ 228/102, 227, 228
See application file for complete search history.

(56) References Cited

U.S. PATENT DOCUMENTS 5,113,581 A * 5/1992 Hidese ............................ 29/840
6,414,271 B2 7/2002 Yokoyama et al.
(Continued)

FOREIGN PATENT DOCUMENTS

| JP | 10-214864 | 8/1998 |
| JP | 10-340915 | 12/1998 |

(Continued)

OTHER PUBLICATIONS

JP 2001358455 A computer english translation.*
(Continued)

*Primary Examiner* — Erin Saad
(74) *Attorney, Agent, or Firm* — Katten Muchin Rosenman LLP

(57) ABSTRACT

A mounting apparatus bonds an electrode of an electronic component and an electrode of a substrate with thermally fusible bond metal to mount the component on a substrate. The apparatus includes a heater base that moves on a path to and from the substrate, a bonding tool, a pedestal to hold the electronic component by vacuum. The bonding tool is heated with a ceramic heater in the heater base to thermally bond the electronic component retained on the pedestal. The bonding tool includes a cooling flow passage providing communication between the upper surface and a side surface of the pedestal. This offers the advantage of shortening the time for cooling during mounting of the electronic component.

15 Claims, 7 Drawing Sheets

(52) U.S. Cl.
CPC ........ *H01L 24/16* (2013.01); *H01L 2224/0401* (2013.01); *H01L 2224/13144* (2013.01); *H01L 2224/16225* (2013.01); *H01L 2224/16227* (2013.01); *H01L 2224/751* (2013.01); *H01L 2224/755* (2013.01); *H01L 2224/75744* (2013.01); *H01L 2224/81191* (2013.01); *H01L 2224/81447* (2013.01); *H01L 2924/01004* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01079* (2013.01); *H01L 2924/12043* (2013.01); *H01L 2924/181* (2013.01)

(56) References Cited

U.S. PATENT DOCUMENTS

2005/0098610 A1* 5/2005 Onobori et al. .......... 228/180.21

2006/0196912 A1 9/2006 Sato

FOREIGN PATENT DOCUMENTS

| JP | 2001358455 A | * 12/2001 |
| JP | 2002-16091 | 1/2002 |
| JP | 2003-303856 | 10/2003 |
| JP | 2006-5031 | 1/2006 |
| JP | 2007-329306 | 12/2007 |
| JP | 2009-76606 | 4/2009 |

OTHER PUBLICATIONS

International Search Report dated Jul. 19, 2011, from corresponding International Application No. PCT/JP2011/064625.

Taiwanese Search Report dated Aug. 13, 2013, from corresponding Taiwanese Application No. 100121185.

* cited by examiner (a)

(b)

(c)

ELECTRONIC COMPONENT MOUNTING APPARATUS AND THE SAME METHOD THEREOF

TECHNICAL FIELD

The present invention relates to a structure of electronic component mounting apparatuses and to an electronic component mounting method using such electronic component mounting apparatuses.

BACKGROUND ART

There are various techniques used for mounting a semiconductor chip on a substrate, such as a technique of mounting an electronic component that is provided with a solder bump formed on an electrode on a substrate through thermal bonding, a gold-solder fusion bond technique of forming a gold bump on an electrode of an electronic component while providing a thin solder film on the surface of a copper electrode of a substrate and thermally fusing and bonding the gold bump and the solder, and a bond technique using a resin adhesive such as a thermoplastic resin or an anisotropic conductive film (AFC). In these bond techniques, the electronic component is heated and pressed against the substrate using a bonding tool with the solder or adhesive on the electrode being fused, and thereafter the solder or adhesive is cooled and solidified to bond the electronic component to the substrate.

There have hence been proposed electronic component mounting apparatuses for use in such bond techniques including a heater for heating and fusing solder or heating and softening adhesive and cooling means for cooling the solder or adhesive after bonding to shorten the time for heating and cooling.

Patent Document 1 proposes a contact heating apparatus including a tool for pressing a heating target, a ceramic heater for heating the tool, a thermal insulator for preventing transfer of heat generated form the ceramic heater to other than the tool, and a holder for integrating and coupling these members to another member, in which a cooling medium passage is provided in the thermal insulator and/or the holder for cooling the heater, the thermal insulator, or the holder, whereby it is possible to heat adhesive or solder rapidly to a temperature at which the adhesive or solder is softened or fused and also to prevent thermal deformation of the apparatus during rapid cooling.

Patent Document 2 proposes an electronic component mounting apparatus including a mounting tool for sucking and holding a semiconductor chip, a heater for heating a sucking portion of the mounting tool, and a flow passage for supplying gas therethrough for cooling thermoplastic resin when the semiconductor chip is pressed against and heated to be mounted on a substrate while fusing thermoplastic resin, whereby it is possible to shorten the takt time for mounting the semiconductor chip with the thermoplastic resin.

RELATED ART DOCUMENTS

Patent Documents

Patent Document 1: Japanese Unexamined Patent Application Publication No. 2002-16091
Patent Document 2: Japanese Unexamined Patent Application Publication No. 2009-76606

SUMMARY OF THE INVENTION

Problems to be Solved by the Invention

However, in the conventional art disclosed in Patent Document 1, the cooling medium flow passage is formed between the ceramic heater and the thermal insulator and cooling air flows through the cooling flow passage to cool the ceramic heater so as to cool a semiconductor chip sucked on a bonding tool that is attached to the side of the ceramic heater opposite to that of the thermal insulator, suffering from a problem of taking a long time to cool the semiconductor chip. In the conventional art disclosed in Patent Document 2, cooling air is supplied through the cooling flow passage provided in the bonding tool and blown around the semiconductor chip to cool the semiconductor chip and the thermoplastic resin from the side surfaces thereof. However, since the semiconductor chip and the thermoplastic resin have a very small thickness relative to the surface area thereof, the entire semiconductor chip cannot be cooled at the same time even if cooling air can be blown around the semiconductor chip, suffering from a problem of taking a long time to cool the semiconductor chip.

It is hence an object of the present invention to shorten the time for cooling during mounting of an electronic component.

Means for Solving the Problems

The present invention is directed to an electronic component mounting apparatus for bonding an electrode of an electronic component and an electrode of a substrate with thermally fusible bond metal to mount the electronic component on the substrate, including: a base portion incorporating a heater, the base portion to be driven in a direction getting close to and away from the substrate; and a bonding tool having a first surface fixed inclose contact to a surface of the base portion and a pedestal formed on a second surface opposite to the first surface to suck and hold the electronic component on the surface thereof, the bonding tool to be heated with the heater in the base portion to thermally bond the electronic component sucked on the surface of the pedestal to the substrate, in which the bonding tool includes a cooling flow passage providing communication between the first surface and a side surface of the pedestal.

In the electronic component mounting apparatus according to the present invention, it is also preferable that the cooling flow passage of the bonding tool at least partially allows cooling medium to flow therethrough along the surface of the pedestal. It is additionally preferable that the base portion has a cooling medium supply passage including a cooling medium inlet provided on a side surface through which cooling medium inflows and a cooling medium supply port provided on the surface to which the bonding tool is fixed in close contact and configured to supply the cooling medium inflowing through the cooling medium inlet to the cooling flow passage of the bonding tool and that the cooling flow passage of the bonding tool is configured to include a groove provided in the first surface and extending along the surface of the pedestal, one end of the groove in communication with the cooling medium supply port and the other end of the groove in communication with a cooling medium outlet provided on the side surface of the pedestal, and the surface of the base portion covering the groove.

In the electronic component mounting apparatus according to the present invention, it is also preferable that the apparatus further includes: a drive unit for driving the base portion in the direction getting close to and away from the substrate; a position detection unit for detecting the position of the bonding tool in the direction getting close to and away from the substrate; a shutoff valve for opening and closing the cooling flow passage of the bonding tool; and a control unit for changing with the drive unit the position of the bonding tool in the direction getting close to and away from the substrate and for opening and closing the shutoff valve, in which the control unit includes bonding tool position holding and cooling means for holding the position of the bonding tool in the direction getting close to and away from the substrate based on the determination that bond metal between the electrode of the electronic component and the electrode of the substrate is thermally fused when the bonding tool gets close to the substrate by a predetermined distance from a reference position while heating the electronic component with the heater and for opening the shutoff valve to supply cooling medium to the cooling flow passage of the bonding tool, so that the bonding tool is cooled. In the electronic component mounting apparatus according to the present invention, it is also preferable that the electronic component includes a bump formed on the electrode and the substrate includes a film of the bond metal formed on the electrode, and that the control unit further includes: contact detecting means for determining whether or not the bump and the film are in contact with each other based on a signal from the position detection unit; and reference position setting means for setting the position of the bonding tool with respect to the substrate as the reference position when the contact detecting means determines that the bump and the film are in contact with each other.

In the electronic component mounting apparatus according to the present invention, it is also preferable that the control unit further includes: second reference position setting means for setting the position of the bonding tool with respect to the substrate as a second reference position after the reference position setting means sets the reference position and when the distance of the bonding tool from the substrate in the direction getting close to and away from the substrate changes from increasing to decreasing; and second bonding tool position holding and cooling means for holding the position of the bonding tool in the direction getting close to and away from the substrate based on the determination that the bond metal between the electrode of the electronic component and the electrode of the substrate is thermally fused when the bonding tool gets close to the substrate by a second predetermined distance from the second reference position while heating the electronic component and for opening the shutoff valve to supply cooling medium to the cooling flow passage of the bonding tool, so that the bonding tool is cooled.

The present invention is also directed to an electronic component mounting method of bonding an electrode of an electronic component and an electrode of a substrate with thermally fusible bond metal to mount the electronic component on the substrate, including the steps of: preparing an electronic component mounting apparatus including: a base portion incorporating a heater, the base portion to be driven in a direction getting close to and away from the substrate; a bonding tool having a first surface fixed in close contact to a surface of the base portion, a pedestal formed on a second surface opposite to the first surface to suck and hold the electronic component on the surface thereof, and a cooling flow passage providing communication between the first surface and a side surface of the pedestal, the bonding tool to be heated with the heater in the base portion to thermally bond the electronic component sucked on the surface of the pedestal to the substrate; a drive unit for driving the base portion in the direction getting close to and away from the substrate; a position detection unit for detecting the position of the bonding tool in the direction getting close to and away from the substrate; and a shutoff valve for opening and closing the cooling flow passage of the bonding tool; and holding the position of the bonding tool in the direction getting close to and away from the substrate based on the determination that the bond metal between the electrode of the electronic component and the electrode of the substrate is thermally fused when the bonding tool gets close to the substrate by a predetermined distance from a reference position while heating the electronic component with the heater and for opening the shutoff valve to supply cooling medium to the cooling flow passage of the bonding tool, so that the bonding tool is cooled.

Advantage

The present invention offers the advantage of shortening the time for cooling during mounting of an electronic component.

MODES FOR CARRYING OUT THE INVENTION

Figure 1:
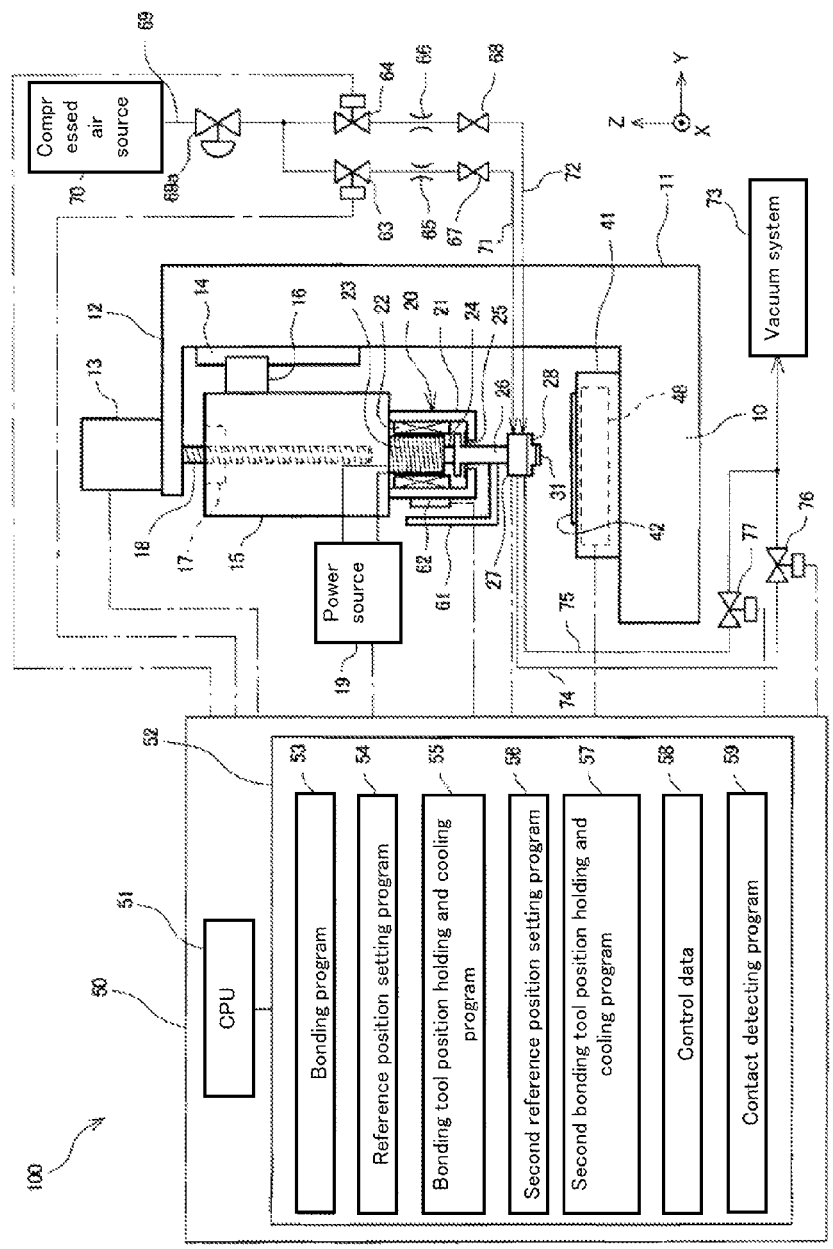
FIG. 1 is a system diagram showing the configuration of an electronic component mounting apparatus according to an exemplary embodiment of the present invention.

Exemplary embodiments of the present invention will hereinafter be described with reference to the accompanying drawings. As shown in FIG. 1, an electronic component mounting apparatus 100 according to the present invention is configured to include a base 10, a frame 11 extending upward from the base 10, an upper flange 12 projecting from an upper portion of the frame 11, a guide 14 provided vertically (in the Z direction) on a side surface of the frame 11, a slider 16 attached vertically slidably to the guide 14, a rise-and-fall block 15 fixed to the slider 16 to be movable vertically with the slider 16, a nut 17 fixed to the rise-and-fall block 15, a feed screw 18 to be screwed into the nut 17, a motor 13 fixed to the upper flange 12 and configured to turn the feed screw 18, a voice coil motor 20 attached to a lower portion of the rise-and-fall block 15, a rod 26 to be driven vertically with the voice coil motor 20, a ceramic heater assembly 27 attached at a leading end of the rod 26 and incorporating a ceramic heater, a bonding tool 28 attached at the lower end of the ceramic heater assembly 27 and configured to suck an electronic component 31, a bonding stage 41 for sucking and fixing a substrate 42 thereon, and a control unit 50. The motor 13 and the voice coil motor 20 configure a drive unit for vertically (in the Z direction) driving the bonding tool 28.

As shown in FIG. 2A, the ceramic heater assembly 27 includes a thin ceramic heater 27h incorporated in a heater base 27a serving as a base portion. In the heater base 27a, there are provided a first vacuum suction groove 95 for vacuum-sucking the bonding tool 28 on the lower surface of the heater base 27a, a first air vacuum passage 94 for vacuuming air out of the first vacuum suction groove 95, and a second air vacuum passage 93 for vacuuming air out of a second vacuum suction groove 98 provided in the lower surface 28e of a pedestal 28c that protrudes on the lower surface 28b of the bonding tool 28. The second air vacuum passage 93 is in communication with a vacuum groove 96 provided in the upper surface 28a of the bonding tool 28 and a third air vacuum passage 97 provides communication between the vacuum groove 96 and the second vacuum suction groove 98 for vacuum-sucking the electronic component 31 provided on the lower surface 28e of the pedestal 28c. The second air vacuum passage 93 can therefore vacuum air out of the second vacuum suction groove 98 through the vacuum groove 96 and the third air vacuum passage 97. The upper surface 28a and the lower surface 28b of the bonding tool 28 correspond, respectively, to the first surface and the second surface described in the appended claims.

FIG. 2B shows the upper surface 28a of the bonding tool 28 in close contact with the heater base 27a as a first surface, viewed along the arrow B of FIG. 2A, where the first vacuum suction groove 95 provided in the lower surface of the heater base 27a is indicated by an alternate long and short dash line. As shown in FIG. 2B, the first vacuum suction groove 95 is a rectangular tubular one. Also, as shown in FIGS. 2A and 2B, a portion of the first vacuum suction groove 95 is in communication with the first air vacuum passage 94 that has a circular cross section and extends vertically (in the Z direction) in the heater base 27a. As shown in FIG. 2B, the vacuum groove 96 provided in the upper surface 28a of the bonding tool 28 is an oval one with one end in communication with the second air vacuum passage 93 and the other end in communication with the third air vacuum passage 97. FIG. 2C shows the lower surface 28e of the pedestal 28c, viewed along the arrow A of FIG. 2A. As shown in FIG. 2C, the second vacuum suction groove 98 is a cruciform one. The first air vacuum passage 94 is in communication with a first air vacuum port 92 provided on a side surface 27b of the heater base 27a and a first vacuum pipe 75 shown in FIG. 1 is connected to the first air vacuum port 92. The second air vacuum passage 93 is in communication with a second air vacuum port 91 provided on the side surface 27b of the heater base 27a and a second vacuum pipe 74 shown in FIG. 1 is connected to the second air vacuum port 91. The first and second vacuum pipes 75 and 74 are connected to a vacuum system 73 and solenoid valves 77 and 76 are provided on the path of the respective first and second vacuum pipes 75 and 74 as shown in FIG. 1.

In the heater base 27a, there are provided a first cooling flow passage 86 through which cooling air serving as cooling medium for cooling the heater base 27a flows, a first air supply passage 84 for supplying cooling air to the first cooling flow passage 86, and a second air supply passage 83 serving as a cooling medium supply passage for supplying cooling air therethrough to cool the bonding tool 28. The first cooling flow passage 86 extends along the lower surface of the heater base 27a between the ceramic heater 27h in the heater base 27a and the bonding tool 28 to be in communication with a first air outlet 90 provided on the side surface 27b of the heater base 27a. The first cooling flow passage 86 is configured to include one or more flow passages extending from one to the other side surface 27b of the heater base 27a and can have a circular, rectangular, or another cross section and extend radially from the center of the heater base 27a toward the each side surface 27b. Air flowing through a first air inlet 82 provided on the side surface 27b of the heater base 27a into the first air supply passage 84 flows through the first cooling flow passage 86 to cool the heater base 27a and then flows out through the first air outlet 90.

The second air supply passage 83 is in communication with a second air inlet 81 provided on the side surface 27b of the heater base 27a and extends downward in the heater base 27a to the lower end of the heater base 27a to be in communication with a third air supply passage 85 extending from the upper surface 28a toward the lower surface 28b of the bonding tool 28 to the middle of the thickness of the pedestal 28c. The end of the second air supply passage 83 on the lower surface of the heater base 27a serves as a cooling medium supply port for supplying cooling air therethrough to the bonding tool 28. A second cooling flow passage 87 extending along the lower surface 28e of the pedestal 28c is provided in the pedestal 28c of the bonding tool 28, the passage 87 in communication with the third air supply passage 85 and a second air outlet 89 provided on a side surface 28d of the pedestal 28c. Cooling air flowing through the second air inlet 81 provided on the side surface 27b of the heater base 27a into the second air supply passage 83 flows into the third air supply passage 85 at an interface between the lower surface of the heater base 27a and the upper surface 28a of the bonding tool 28 and into the second cooling flow passage 87 to cool the bonding tool 28, and then flows out through the second air outlet 89 provided on the side surface 28d of the pedestal 28c. As shown in FIGS. 2B and 2C, the second cooling flow passage 87 extends radially from the third air supply passage 85 toward the each side surface 28d of the pedestal 28c and can have a circular, rectangular, or another cross section. Alternatively, the second cooling flow passage 87 can be in communication with the third air supply passage 85 and extend from one to the other side surface 28d of the pedestal 28c.

As shown in FIG. 2A, a first air pipe 72 shown in FIG. 1 is connected to the first air inlet 82 and a second air pipe 71 shown in FIG. 1 is connected to the second air inlet 81. As shown in FIG. 1, throttle valves 68 and 67, flowmeters 66 and 65, and solenoid valves 64 and 63 are provided in the respective first and second air pipes 72 and 71. The first and second air pipes 72 and 71 join on the upstream side of the solenoid valves 64 and 63 to serve as an air supply pipe 69. The air supply pipe 69 is connected to a compressed air source 70 and a pressure reduction valve 69a is provided in the air supply pipe 69 to reduce the pressure of air supplied from the compressed air source 70 to a pressure at which the air is supplied into the first and second air pipes 72 and 71. The solenoid valves 64 and 63 are shutoff valves for opening and closing the respective first and second air pipes 72 and 71, the first, second, and third air supply passages 84, 83, and 85, and the first and second cooling flow passages 86 and 87 connected to the first and second air pipes 72 and 71.

As shown in FIG. 1, the voice coil motor 20 is configured to include a casing 21, a permanent magnet stator 22 fixed along the inner periphery of the casing 21, and a movable coil 23 arranged inside the stator 22. The rod 26 is attached to the casing 21 via a plate spring 25. An L-shaped linear scale 61 with a finely-scaled vertical portion is fixed to the rod 26. Also, a linear scale head 62 for reading a pattern on the linear scale 61 is attached to the outer surface of the casing 21 in a manner facing toward the linear scale 61. The linear scale 61 and the linear scale head 62 configure a position detection unit for detecting the position of the bonding tool 28 in the height direction, and the linear scale head 62 is connected to the control unit 50. The coil 23 of the voice coil motor 20 is supplied with driving power from a power source 19. The bonding stage 41 incorporates a stage heater 48 for heating the substrate 42 sucked and fixed on the bonding stage 41. The bonding stage 41 is also configured to be movable in the X and Y directions with a drive mechanism not shown.

The control unit 50 is a computer incorporating a CPU 51 for signal processing and a memory 52. The memory 52 stores a bonding program 53 for bonding control, control data 58, a reference position setting program 54, a bonding tool position holding and cooling program 55, a second reference position setting program 56, a second bonding tool position holding and cooling program 57, and a contact detecting program 59.

The motor 13 is connected to the control unit 50 and arranged such that the direction and angle of rotation are controlled with a command from the control unit 50. The power source 19 is also connected to the control unit 50 and arranged such that the current and voltage output to the coil 23 are altered with a command from the control unit 50. The ceramic heater assembly 27 and the stage heater 48 are also connected to the control unit 50 and arranged such that the heating state is controlled with a command from the control unit 50. Also, the solenoid valves 64 and 63 provided in the first and second air pipes 72 and 71 and the solenoid valves 77 and 76 provided in the first and second vacuum pipes 75 and 74 are also connected to the control unit 50 and arranged to be opened and closed with a command from the control unit 50.

Figure 3:
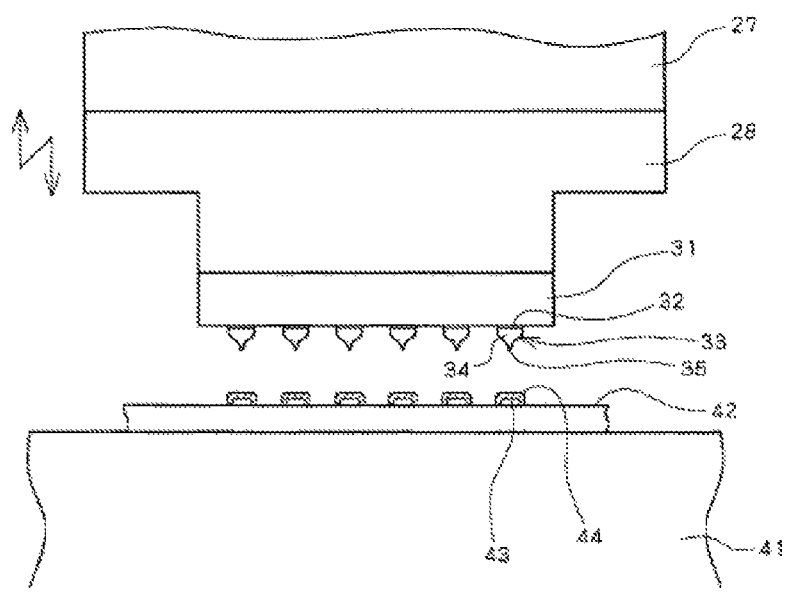
FIG. 3 is an illustrative view showing an electronic component and a substrate set in the electronic component mounting apparatus according to the exemplary embodiment of the present invention.

As shown in FIG. 3, the electronic component 31, which is sucked upside down at the leading end of the bonding tool 28, has multiple electrodes 32 provided on the surface thereof, and each gold bump 33 is formed on each of the electrodes 32. Each gold bump 33 has a disk-shaped base portion 34 on the side of the electrode 32 and a conical convex portion 35 protruding from the base portion. The substrate 42, which is sucked and fixed on the bonding stage 41, has copper electrodes 43 formed on the surface thereof, and a solder film 44 is formed on each of the copper electrodes 43. The solder film 44 has a very small thickness of about 10 to 30 μm. The electrode 32, the gold bump 33, and the copper electrode 43 of the substrate are arranged in a manner facing toward each other.

Figure 4:
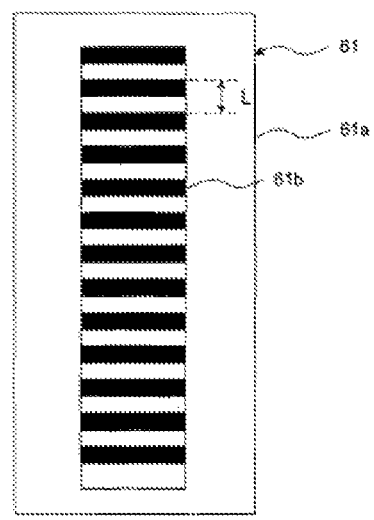
FIG. 4 is a schematic view showing a linear scale used in the electronic component mounting apparatus according to the exemplary embodiment of the present invention.

As shown in FIG. 4, the linear scale 61 includes a linear scale main body 61a on which a pattern 61b with a very fine pitch L is provided. The linear scale head 62 incorporates a light source for irradiating light to the pattern 61b on the linear scale 61, a grating through which the light from the light source passes, a light-receiving device for detecting light reflected from the pattern 61b on the linear scale 61, and a signal processing unit for processing a signal input from the light-receiving device. Light emitted from the light source passes through the grating and undergoes reflection at the pattern 61b on the linear scale 61 to generate an interference fringe on, for example, a photodiode serving as the light-receiving device. When the linear scale 61 moves relatively to the linear scale head 62 in the longitudinal direction of the pattern 61b, the interference fringe also moves and thereby the light-receiving device outputs a sine-wave signal with a period equal to or half the pitch L of the pattern 61b. The sine-wave signal is a biphasic sine wave with 90-degree mutually shifted phases. The linear scale head 62 instructs the signal processing unit to output a distance of relative movement of the linear scale 61 to the linear scale head 62 based on the output difference of the biphasic sine wave. The detection accuracy of the distance of movement is about 1 nm if the pitch L of the pattern 61b is several micrometers, for example.

Figure 2:
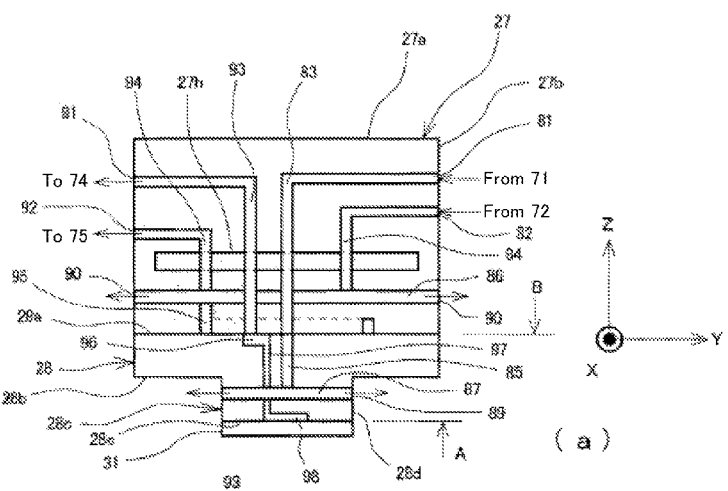
FIG. 2A is an illustrative view showing air flow passages in a heater assembly and a bonding tool of the electronic component mounting apparatus according to the exemplary embodiment of the present invention.
FIG. 2B shows the upper surface 28a of the bonding tool 28 in close contact with a heater base 27a as a first surface, viewed along the arrow B of FIG. 2A.
FIG. 2C shows the lower surface 28e of a pedestal 28c, viewed along the arrow A of FIG. 2A.
Figure 2:
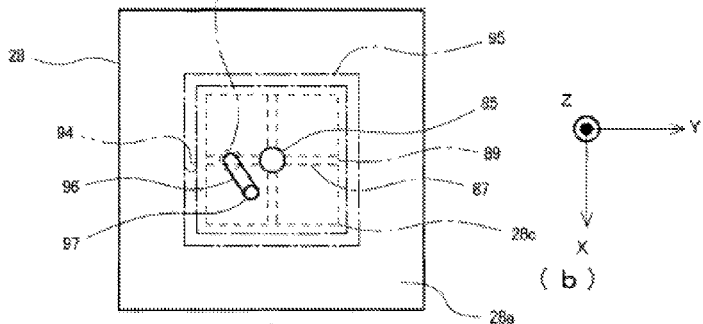
Figure 2:
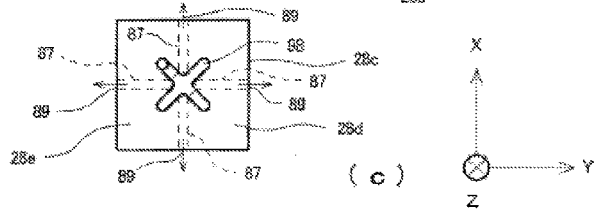
Figure 5:
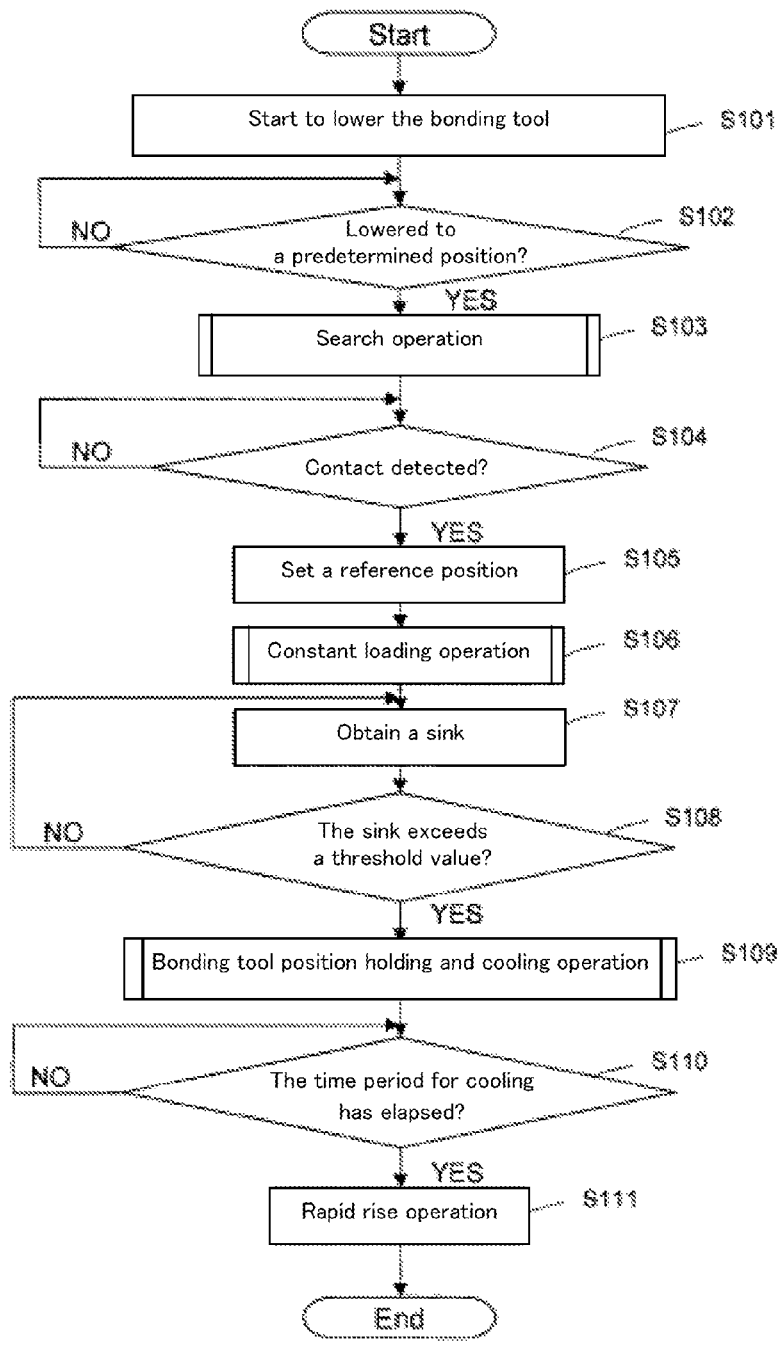
FIG. 5 is a flow chart showing an operation of the electronic component mounting apparatus according to the exemplary embodiment of the present invention.
Figure 6:
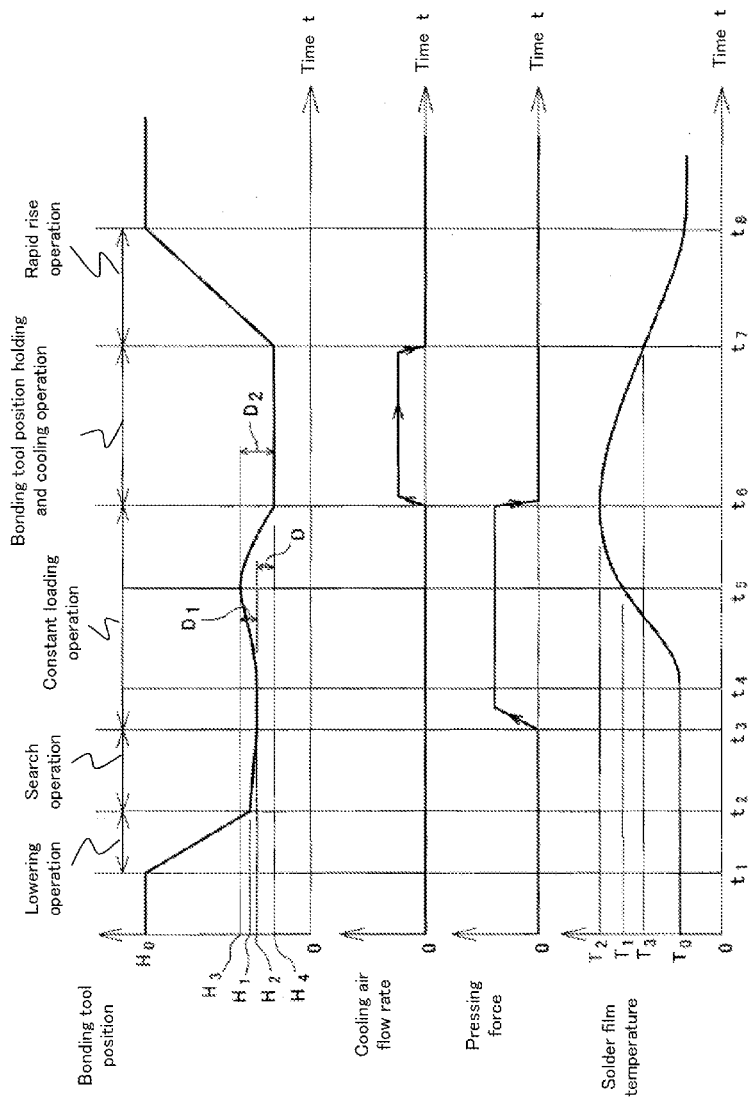
FIG. 6 is an illustrative view showing the change in the position of the bonding tool, the pressing force, the flow rate of cooling air, and the temperature of a solder film during an operation of the electronic component mounting apparatus according to the exemplary embodiment of the present invention.
Figure 7:
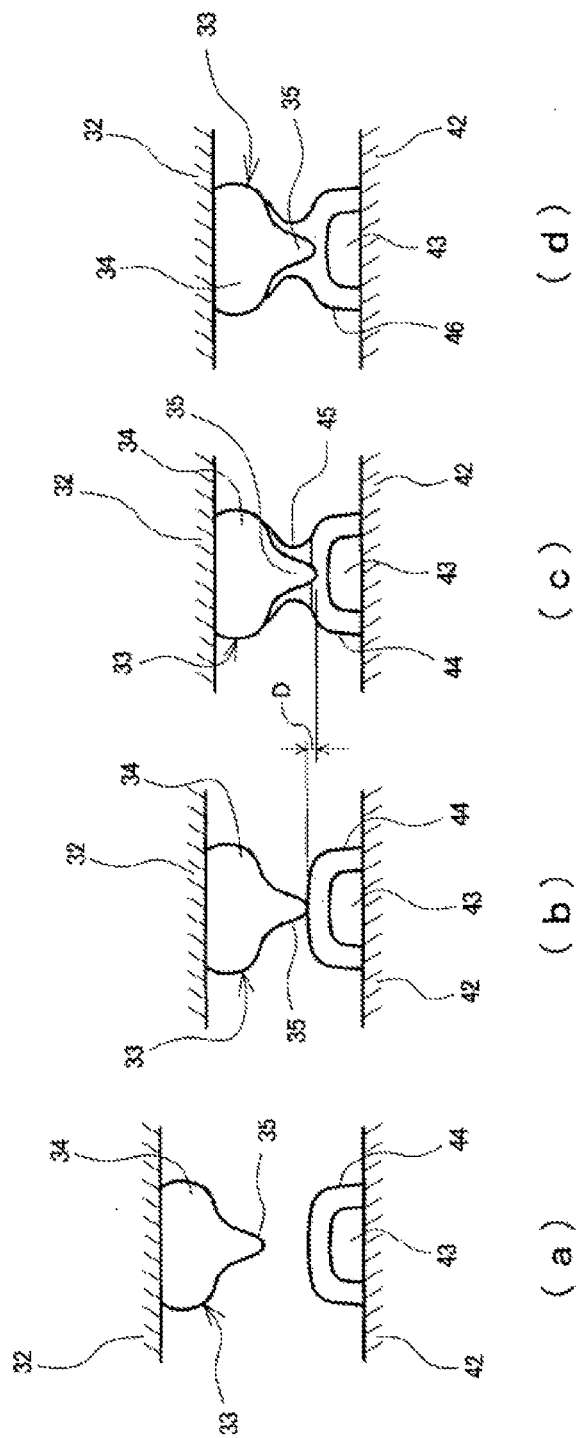
FIG. 7 is an illustrative view showing a process of gold-solder fusion bond between a bump and a solder layer performed by the electronic component mounting apparatus according to the exemplary embodiment of the present invention.

With reference to FIGS. 5 to 7, a bonding operation will be described of bonding the electronic component 31 and the substrate 42 shown in FIG. 3 using the thus configured electronic component mounting apparatus 100. It is here noted that the electronic component 31 includes a semiconductor chip, a transistor, and a diode. The control unit 50 opens the solenoid valve 77 to vacuum air through the first vacuum pipe 75 out of the first air vacuum passage 94 provided in the ceramic heater assembly 27 as shown in FIG. 2 and thereby to evacuate the first vacuum suction groove 95, so that the bonding tool 28 is vacuum-sucked on the lower surface of the ceramic heater assembly 27. The control unit 50 also opens the solenoid valve 76 to vacuum air through the second vacuum pipe 74 out of the second air vacuum passage 93, the vacuum groove 96, and the third air vacuum passage 97 provided in the ceramic heater assembly 27 as shown in FIG. 2 and thereby to evacuate the second vacuum suction groove 98 of the bonding tool 28, so that the electronic component 31 is vacuum-sucked on the lower surface 28e of the pedestal 28c of the bonding tool 28. The control unit 50 drives the bonding stage 41 in the X and Y directions to perform alignment of the electrodes 32 of the electronic component 31 with respect to the copper electrodes 43 of the substrate 42 as shown in FIG. 3. The solenoid valves 63 and 64 shown in FIG. 1 are initially closed not to allow cooling air to flow into the ceramic heater assembly 27.

After the alignment is completed, the control unit 50 starts a lowering operation of lowering the bonding tool from an initial height $H_0$ as shown in step S101 of FIG. 5 and the time interval from $t_1$ to $t_2$ of FIG. 6. This lowering operation is performed by rotating the motor 13 shown in FIG. 1 and thereby turning the feed screw 18, so that the rise-and-fall block 15 with the nut 17 into which the feed screw 18 is being screwed fixed therein moves downward. The control unit 50 detects a lowered position based on the angle of rotation of the motor 13 and, as shown in step S102 of FIG. 5, determines whether or not the bonding tool is lowered to a predetermined height $H_1$ shown in FIG. 6. When the bonding tool is lowered to the height $H_1$, the gold bump 33 comes very close to the solder film 44 and the copper electrode 43 as shown in FIG. 7 (a), yet there is still a gap between the convex portion 35 of the gold bump 33 and the solder film 44. In this lowering operation, since the voice coil motor 20, the rod 26, and the bonding tool 28 are lowered integrally, there occurs no height difference between the linear scale 61 attached to the rod 26 and the casing 21 of the voice coil motor 20 and the detection signal from the linear scale head 62 remains unchanged from an initial output.

The control unit 50, if determines that the bonding tool is lowered to the predetermined height $H_1$, stops the motor 13 and therefore the lowering operation and then, as shown in step S103 of FIG. 5, starts a search operation of detecting a position where the leading end of the gold bump 33 shown in FIG. 3 comes into contact with the solder film 44 on the copper electrode 43 of the substrate 42. In this search operation, the bonding tool 28 is lowered slowly until the leading end of the convex portion 35 of the gold bump 33 comes into contact with the surface of the solder film 44 as shown in the time interval from $t_2$ to $t_3$ of FIG. 6. This operation is performed by, for example, changing the current through the coil 23 of the voice coil motor 20 as follows.

When the control unit 50 outputs a command for position lowering during the search operation, the power source 19 applies a current to the coil 23 of the voice coil motor 20 based on the command value for position lowering. Accordingly, the coil 23 moves downward, so that the leading end 24 of the coil comes into contact with the upper end of the rod 26. Since the rod 26 is attached to the casing 21 via the plate spring 25, when an increased current flows through the coil 23 to result in that the leading end 24 of the coil 23 presses down the rod 26 and the plate spring 25 undergoes a deflection according to the pressing force, the rod 26 moves downward and thereby the leading end of the bonding tool 28 is lowered gradually. When the rod 26 moves downward, there occurs a relative height difference between the linear scale 61 fixed to the rod 26 and the casing 21 of the voice coil motor 20, which causes the linear scale head 62 to detect the distance of movement of the linear scale 61. The control unit 50 obtains the lowered position of the bonding tool 28 based on the change in the signal detected with the linear scale head 62 and feeds back the command value for position lowering to adjust the current output from the power source. The control unit 50 can thus perform a search operation of gradually increasing the current through the coil 23 to lower the leading end of the bonding tool 28 slowly.

During the search operation, the control unit 50 monitors whether or not leading end of the convex portion 35 of the gold bump 33 is in contact with the surface of the solder film 44 by contact detecting means as shown in step S104 of FIG. 5. When the leading end of the convex portion 35 of the gold bump 33 comes into contact with the solder film 44, the coil 23 stops moving downward and there starts to appear a difference between the lowered position detected with the linear scale head 62 and the command value for position lowering during the search operation. When the difference between the command value for position lowering and the lowered position detected with the linear scale head 62 exceeds a predetermined threshold value, the control unit 50 determines that the leading end of the convex portion 35 of the gold bump 33 comes into contact with the solder film 44 (contact detecting step). It is noted that since the vertical position of the linear scale 61 is adjusted such that the longitudinal center of the pattern 61b comes directly in front of the linear scale head 62 when the leading end of the convex portion 35 of the gold bump 33 comes into contact with the solder film 44, the linear scale head 62 can measure the distance of vertical movement centering on the point at which the leading end of the convex portion 35 of the gold bump 33 comes into contact with the solder film 44.

The control unit 50, if determines that the leading end of the convex portion 35 of the gold bump 33 comes into contact with the solder film 44, determines that the bonding tool 28 reaches a reference height $H_2$ and sets the height $H_2$ detected with the linear scale head 62 as a reference height (reference position) of the bonding tool 28 as shown in step S105 of FIG. 5 and the time $t_3$ of FIG. 6 (reference position setting step). FIG. 7(b) shows a state where the leading end of the convex portion 35 of the gold bump 33 comes into contact with the solder film 44.

After setting the reference height, the control unit 50 performs a constant loading operation in which the bonding tool 28 presses down the substrate 42 at a constant pressing force as shown in step S106 of FIG. 5. In this operation, an approximately constant current can flow through the coil 23 of the voice coil motor 20, for example, so that the leading end 24 of the coil 23 presses down the rod 26 at a constant force. Alternatively, a sensor for detecting a pressing force at which the bonding tool 28 presses down the substrate 42 can be provided and the current through the coil 23 can be controlled to change such that the pressing force detected by the sensor represents a constant value, as mentioned above. As shown in step S107 of FIG. 5, the control unit 50 takes difference between the distance of vertical movement detected with the linear scale head 62 and the reference height $H_2$ to calculate the distance by which the bonding tool 28 comes close to the substrate 42 from the height $H_2$ (reference height) when the leading end of the convex portion 35 of the gold bump 33 comes into contact with the solder film 44, that is, the distance of downward movement from the reference height $H_2$ as a sink D. The control unit 50 then starts to monitor if the sink D exceeds a predetermined threshold value as shown in step S108 of FIG. 5.

Since the leading end of the convex portion 35 of the gold bump 33 is not in contact with the solder film 44 in the time interval from $t_1$ to $t_3$ of FIG. 6, the solder film 44 is heated with the stage heater 48 shown in FIG. 1 to have the same temperature $T_0$ as the substrate 42. In contrast, the electronic component 31 is heated to a high temperature with the ceramic heater 27h disposed on the bonding tool 28. Accordingly, when the leading end of the convex portion 35 of the gold bump 33 comes into contact with the solder film 44 at the time $t_3$ of FIG. 6, heat starts to transfer from the leading end of the convex portion 35 of the gold bump 33 to the solder film 44. The temperature of the solder film 44 then starts to rise at the time $t_4$ of FIG. 6. As the temperature of the solder film 44 rises in the time interval from $t_4$ to $t_5$ of FIG. 6, the temperature of the copper electrode 43 also rises accordingly to result in that the copper electrode 43 and the solder film 44 undergo thermal expansion. Since the pressing force is constant during this time interval, the bonding tool 28 is raised gradually from the reference height $H_2$ when the leading end of the gold bump 33 comes into contact with the solder film 44, and finally reaches a height $H_3$ at the time $t_5$. At this time, the bonding tool 28 is positioned at the height $H_3$, which is greater than the reference height $H_2$, so that the distance of downward movement $D_1$ ($=H_2-H_3$) from the reference height $H_2$ is negative as shown in FIG. 6, that is, the sink D does not exceed the predetermined threshold value.

At the time $t_5$ of FIG. 6, when the solder film 44 is heated to a temperature $T_1$ at which the solder is fused, the solder film 44 starts to be fused. In this case, the bonding tool 28 is controlled to have a constant pressing force, which causes the convex portion 35 of the gold bump 33 to sink into the fused solder film 44 as shown in FIG. 7(c). That is, the height of the bonding tool 28 changes from increasing to decreasing at the time $t_5$ and height $H_3$ shown in FIG. 6. The lowered convex portion 35 is then surrounded with the fused solder 45. As the leading end of the convex portion 35 of the gold bump 33 thus sinks into the solder film 44, the height of the bonding tool 28 is made lower than the reference height $H_2$, that is, the sink D, the distance of downward movement from the reference height $H_2$, becomes positive. When the bonding tool is lowered to a height $H_4$ and the sink D (=$H_2$-$H_4$) becomes a predetermined value at the time $t_6$ of FIG. 6, the solder film 44 exists at a thickness of several micrometers between the leading end of the convex portion 35 of the gold bump 33 and the copper electrode 43 of the substrate 42 as shown in FIG. 7 (c). When the sink D exceeds a predetermined threshold value, the control unit 50 stops the constant loading control based on the determination that the solder film 44 is thermally fused and then starts a bonding tool position holding and cooling operation of cooling the ceramic heater 27h and the bonding tool 28 while holding the height $H_4$ of the bonding tool 28 at the time $t_6$ as shown in step S109 of FIG. 5.

In this operation, the current through the coil 23 of the voice coil motor 20 can be changed, for example, such that the difference between the height $H_4$ that is in a state of an indication obtained from the linear scale head 62 by moving the bonding tool 28 in the distance of vertical movement and the reference height $H_2$ becomes equal to or smaller than a predetermined threshold value. Since the solder film 44 has a thickness of 10 to 30 µm, measuring and controlling the vertical position of the bonding tool 28 using the linear scale head 62 in the order of about 1 nm allows the solder film 44 to exist stably at a thickness of several micrometers between the leading end of the convex portion 35 of the gold bump 33 and the copper electrode 43 of the substrate 42 as shown in FIG. 7 (c).

At the start of the bonding tool position holding and cooling operation, the control unit 50 turns off the ceramic heater 27h heating the bonding tool 28 and supplies cooling air to the ceramic heater assembly 27 and the bonding tool 28 to cool the ceramic heater 27h, the bonding tool 28, and the electronic component 31 sucked at the leading end thereof. The control unit 50 opens the solenoid valves 63 and 64 shown in FIG. 1 to allow cooling air flow from the first and second air pipes 72 and 71 through the first and second air inlets 82 and 81 into the first and second air supply passages 84 and 83 shown in FIG. 2. The cooling air flowing into the first air supply passage 84 flows horizontally through the first cooling flow passage 86 provided below the ceramic heater 27h to cool the portion of the heater base 27a between the ceramic heater 27h and the bonding tool 28. The air flowing through the first cooling flow passage 86 to cool the heater base 27a flows out through the first air outlet 90. The cooling air flowing into the second air supply passage 83 flows through the third air supply passage 85 and then into the second cooling flow passage 87 to flow horizontally along the lower surface 28e of the pedestal 28c, and then flows out through the second air outlet 89 provided on the side surface 28d of the pedestal 28c.

Air inflowing through the first and second air inlets 82 and 81 thus cools the portion of the heater base 27a below the ceramic heater 27h and the bonding tool 28, whereby the electronic component 31 sucked at the leading end of the bonding tool 28 can be cooled more effectively. As the electronic component 31 is cooled, the gold bump 33 shown in FIG. 7 (c) also gets cold rapidly and the solder 45 around the convex portion 35 of the gold bump 33 starts to be cooled while the solder film 44 exists stably at a thickness of several micrometers between the leading end of the convex portion 35 of the gold bump 33 and the copper electrode 43 of the substrate 42. At the time $t_7$ of FIG. 6, when the solder film 44 is cooled to a temperature $T_3$ at which the solder is solidified, the solder 45 starts to be solidified to be bond metal 46 with the solder film 44 existing at a thickness of several micrometers between the leading end of the convex portion 35 of the gold bump 33 and the copper electrode 43 of the substrate 42 as shown in FIG. 7 (d).

After a predetermined period of time has elapsed, the control unit 50 determines that the cooling operation is completed as shown in step S110 of FIG. 5 and closes the solenoid valves 63 and 64 shown in FIG. 1 at the time $t_7$ of FIG. 6 to stop the inflow of cooling air. The control unit 50 then closes the solenoid valve 76 to stop the vacuuming of air through the second air vacuum passage 93 to release the vacuum of the second vacuum suction groove 98 and therefore the electronic component 31 sucked and fixed on the lower surface 28e of the pedestal 28c of the bonding tool 28. The control unit 50 then closes the solenoid valve 76 to stop the vacuuming of air through the second air vacuum passage 93 to release the vacuum of the second vacuum suction groove 98, so that a suction of the electronic component 31 sucked and fixed on the lower surface 28e of the pedestal 28c of the bonding tool 28 is released. Thereafter, the control unit 50 raises the bonding tool 28 to the initial height $H_0$ by rotating the motor 13 and thereby turning the feed screw 18 as shown in step S111 of FIG. 5 to complete the bonding of the electronic component 31.

As described heretofore, in the electronic component mounting apparatus 100 of this exemplary embodiment, the portion of the heater base 27a below the ceramic heater 27h and the bonding tool 28 are cooled, whereby the electronic component 31 sucked at the leading end of the bonding tool 28 can be cooled more effectively and thus the solder can be solidified in a shorter period of time, resulting in a reduction in the time for bonding. In addition, since the electronic component mounting apparatus 100 of this exemplary embodiment transits from the constant loading control to the bonding tool position holding and cooling control by determining that the solder film 44 is fused based on the sink D of the bonding tool 28, the bonding tool 28 can be held at a height after a small sink D due to solder fusion. This allows the solder to be solidified and the electronic component 31 to be mounted with the leading end of the convex portion 35 of the gold bump 33 existing within the thin solder film 44 without being in contact with the copper electrode 43 of the substrate 42. It is thus possible to prevent the convex portion 35 of the gold bump 33 from coming into contact with the copper electrode 43, whereby it is also possible to prevent the gold bump 33 from being deformed to come into fault contact with an adjacent gold bump 33 and the electronic component from being damaged through contact loading, resulting in an improvement in the bonding quality.

Although the exemplary embodiment above describes the case of setting the reading of the linear scale when the leading end of the convex portion 35 of the gold bump 33 is in contact with the solder film 44 and the bonding tool 28 is at the reference height $H_2$ as reference reading, the reading of the linear scale 61 at the height $H_3$ at the time $t_5$ of FIG. 6 that the height of the bonding tool 28 changes from increasing to decreasing after the leading end of the convex portion 35 of the gold bump 33 comes into contact with the solder film 44 can be read with the linear scale head 62 and set as second reference reading (second reference position setting step). In this case, the control is switched from constant loading to bonding tool position holding and cooling when the sink becomes $D_2$=$H_3$-$H_4$ as shown in FIG. 6, as is the case in the above-described exemplary embodiment (second bonding tool position holding and cooling operation). This offers the same advantage as the above-described exemplary embodiment.

Figure 8:
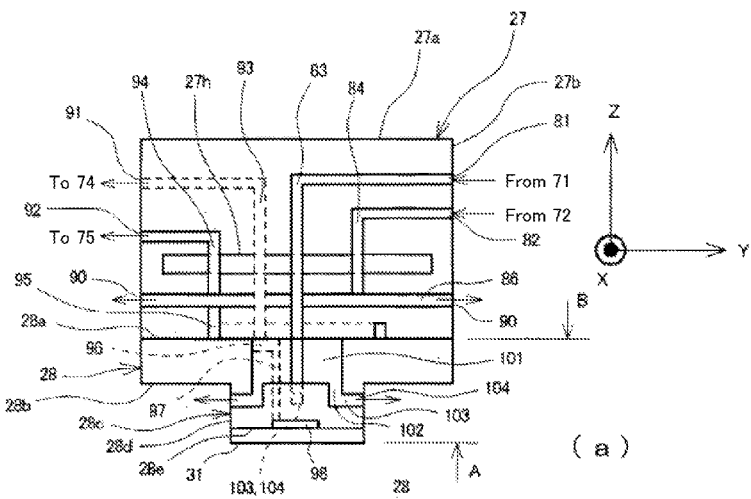
FIG. 8A is an illustrative view showing air flow passages in a heater assembly and a bonding tool of an electronic component mounting apparatus according to another exemplary embodiment of the present invention.
FIG. 8B shows the upper surface 28a of the bonding tool 28 inclose contact with a heater base 27a as a first surface, viewed along the arrow B of FIG. 8A.
FIG. 8C shows the lower surface 28e of a pedestal 28c, viewed along the arrow A of FIG. 8A.
Figure 8:
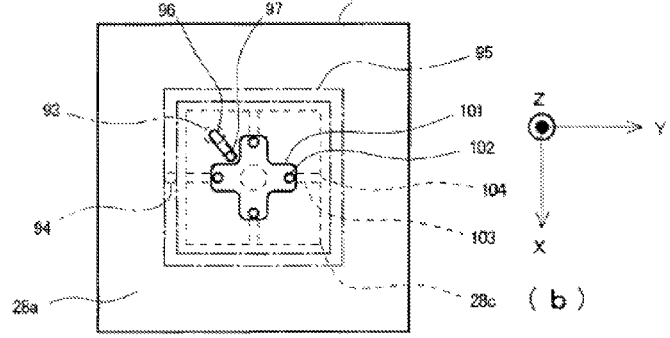
Figure 8:
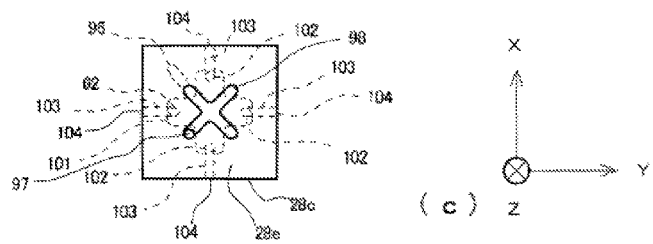

Another exemplary embodiment of the present invention will be described with reference to FIG. 8. Components identical to those described with reference to FIGS. 1 to 7 are designated by the same reference numerals to omit the description thereof. This exemplary embodiment has the same configuration as the exemplary embodiment described with reference to FIGS. 1 to 7 except for the position of the second air vacuum passage 93, the vacuum groove 96, and the third air vacuum passage 97 provided in the ceramic heater assembly 27 and the bonding tool 28 and the shape of the cooling air flow passage provided in the bonding tool 28 as shown in FIG. 8.

As shown in FIG. 8B, a cruciform groove 101 having a rectangular cross section is formed in the upper surface 28a of the bonding tool 28, viewed along the arrow B of FIG. 8A. When the bonding tool 28 is sucked on the lower surface of the heater base 27a of the ceramic heater assembly 27 with the vacuum of the first vacuum suction groove 95, an upper surface of the groove 101 is covered with the lower surface of the heater base 27a to be a cooling flow passage having a rectangular cross section and extending in four directions from the center of the bonding tool. The second air supply passage 83 is configured to communicate with the central portion of the groove 101. The end of the second air supply passage 83 on the lower surface of the heater base 27a serves as a cooling medium supply port for supplying cooling air therethrough to the rectangular cooling flow passage formed with the groove 101 and the heater base 27a. FIG. 8C shows the lower surface 28e of the pedestal 28c, viewed along the arrow A of FIG. 8A. As shown in FIG. 8C, the pedestal 28c is provided with a third cooling flow passage 103 extending along the lower surface 28e of the pedestal 28c to be in communication with a third air outlet 104 provided on each side surface 28d. A fourth air supply passage 102 extending from the groove 101 in the thickness direction of the bonding tool 28 to be in communication with the third cooling flow passage 103 is provided at the end of the groove 101 on the side of each side surface 28d of the pedestal 28c. The third air vacuum passage 97 is positioned not to be in contact with the above-described groove 101 and, accordingly, the vacuum groove 96 and the second air vacuum passage 93 are also arranged.

Cooling air inflowing through the second air inlet 81 flows through the second air supply passage 83 into the groove 101 and flows through the groove 101 in four directions in the bonding tool 28 to cool the bonding tool 28, and then flows through the fourth air supply passage 102 into the third cooling flow passage 103 to cool the pedestal 28c of the bonding tool 28 and flows out through the third air outlet 104 provided on the each side surface of the pedestal 28c.

This exemplary embodiment offers the same advantage as the above-described exemplary embodiment. Further, in this exemplary embodiment, the cooling flow passage in the bonding tool 28 is partially formed by covering the groove 101 provided in the upper surface 28a of the bonding tool 28 with the lower surface of the heater base 27a of the ceramic heater assembly 27, whereby the cooling flow passage can be processed easily.

The groove 101 can have any shape as long as capable of forming a cooling flow passage for cooling the bonding tool 28 with the groove and the lower surface of the heater base 27a, though has a cruciform in this exemplary embodiment. Also, the third air outlet 104 can not be provided on each side surface 28d of the pedestal 28c, but can be provided on at least one of the side surfaces 28d.

Although the exemplary embodiments above describe the case of opening and closing the first, second, and third cooling flow passages 86, 87, and 103 for cooling the ceramic heater assembly 27 and the bonding tool 28 by opening and closing the solenoid valves 63 and 64, the solenoid valves 63 and 64 can be flow rate controllable valves and the degree of opening of these valves can be controlled, so that the flow rate of air varies according to the time for cooling. Alternatively, the flow rate of air can vary according to, for example, the temperature of the electronic component 31.

The present invention is not limited to the above-described exemplary embodiments, and various variations and modifications can be made without departing from the technical scope and nature of the invention defined in the appended claims.

DESCRIPTION OF REFERENCE NUMERALS

10 Base
11 Frame
12 Upper flange
13 Motor
14 Guide
15 Rise-and-fall block
16 Slider
17 Nut
18 Feed screw
19 Power source
20 Voice coil motor
21 Casing
22 Stator
23 Coil
24 Leading end
25 Plate spring
26 Rod
27 Ceramic heater assembly
27a Heater base
27b Side surface
27h Ceramic heater
28 Bonding tool
28a Upper surface
28b, 28e Lower surfaces
28c Pedestal
28d Side surface
31 Electronic component
32 Electrode
33 Gold bump
34 Base portion
35 Convex portion
41 Bonding stage
42 Substrate
43 Copper electrode
44 Solder film
46 Bond metal
48 Stage heater
50 Control unit
51 CPU
52 Memory
53 Bonding program
54 Reference position setting program
55 Bonding tool position holding and cooling program
56 Second reference position setting program
57 Second bonding tool position holding and cooling program
58 Control data
59 Contact detecting program
61 Linear scale
61a Linear scale main body
61b Pattern
62 Linear scale head
63, 64, 76, 77 Solenoid valves
65, 66 Flowmeters
67, 68 Throttle valves 69 Air supply pipe
69a Pressure reduction valve
70 Compressed air source
71 Second air pipe
72 First air pipe
73 Vacuum system
74 Second vacuum pipe
75 First vacuum pipe
81 Second air inlet
82 First air inlet
83 Second air supply passage
84 First air supply passage
85 Third air supply passage
86 First cooling flow passage
87 Second cooling flow passage
89 Second air outlet
90 First air outlet
91 Second air vacuum port
92 First air vacuum port
93 Second air vacuum passage
94 First air vacuum passage
95 First vacuum suction groove
96 Vacuum groove
97 Third air vacuum passage
98 Second vacuum suction groove
100 Electronic component mounting apparatus
101 Groove
102 Fourth air supply passage
103 Third cooling flow passage
104 Third air outlet

The invention claimed is:

1. An electronic component mounting apparatus for mounting an electronic component on a substrate, the apparatus comprising:
   a base portion comprising a base portion surface, the base portion being driven along a path toward and from the substrate;
   a heater incorporated in the base portion;
   a bonding tool comprising
      a first surface fixed in close contact to the base portion surface,
      a second surface opposite to the first surface,
      a pedestal formed on the second surface, the pedestal comprising
         a side surface,
         a retaining surface on which the electronic component is retained, and
         a second vacuum groove recessed in the retaining surface, the second vacuum groove in fluid communication with a vacuum system to suction the electronic component to the retaining surface, and
   a first vacuum groove provided in the base portion, the first vacuum groove suctioning the bonding tool to the base portion;
   a first cooling flow passage providing for cooling the base portion from an internal side of the base portion and that extends along the first surface inside the base portion; and
   a second cooling flow passage providing for cooling the bonding tool from an internal side of the bonding tool and that is communicated with between the first surface and the side surface of the pedestal;
      wherein the heater heats the bonding tool to thermally bond the electronic component retained on the retaining surface to the substrate; and
   wherein an electrode of the electronic component and an electrode of the substrate are bonded with a thermally fusible bond metal;
   wherein the second cooling flow passage of the bonding tool at least partially allows cooling medium to flow therethrough along the retaining surface of the pedestal, and
   wherein the second cooling flow passage of the bonding tool is configured to include a cooling flow groove provided in the first surface and extending along the surface of the pedestal, one end of the cooling flow groove in communication with a cooling medium supply port and the other end of the cooling flow groove in communication with a cooling medium outlet provided on the side surface of the pedestal, and the surface of the base portion covering the cooling flow groove.

2. An electronic component mounting apparatus for mounting an electronic component on a substrate, the apparatus comprising:
   a base portion comprising a base portion surface, the base portion being driven along a path toward and from the substrate;
   a heater incorporated in the base portion;
   a bonding tool comprising
      a first surface fixed in close contact to the base portion surface,
      a second surface opposite to the first surface,
      a pedestal formed on the second surface, the pedestal comprising
         a side surface,
         a retaining surface on which the electronic component is retained, and
         a second vacuum groove recessed in the retaining surface, the second vacuum groove in fluid communication with a vacuum system to suction the electronic component to the retaining surface, and
   a first vacuum groove provided in the base portion, the first vacuum groove suctioning the bonding tool to the base portion;
   a first cooling flow passage providing for cooling the base portion from an internal side of the base portion and that extends along the first surface inside the base portion; and
   a second cooling flow passage providing for cooling the bonding tool from an internal side of the bonding tool and that is communicated with between the first surface and the side surface of the pedestal;
      wherein the heater heats the bonding tool to thermally bond the electronic component retained on the retaining surface to the substrate; and
   wherein an electrode of the electronic component and an electrode of the substrate are bonded with a thermally fusible bond metal;
   wherein the base portion has a cooling medium supply passage including a cooling medium inlet provided on a base portion side surface through which cooling medium inflows and a cooling medium supply port provided on the base portion surface to which the bonding tool is fixed in close contact and configured to supply the cooling medium inflowing through the cooling medium inlet to the second cooling flow passage of the bonding tool.

3. The electronic component mounting apparatus according to claim 1, further comprising
   a drive unit for driving the base portion along the path toward and from the substrate;

a position detection unit for detecting the position of the bonding tool on the path;

a shut-off valve for opening and closing the first cooling flow passage of the base portion and the second cooling flow passage of the bonding tool; and a control unit for moving the bonding tool on the path and for opening and closing the shut-off valve with the drive unit;

wherein the control unit comprises a bonding tool position holding and cooling program for holding a position of the bonding tool on the path based on a determination that the bond metal between the electrode of the electronic component and the electrode of the substrate is thermally fused when the bonding tool gets close to the substrate by a predetermined distance from a reference position on the path while heating the electronic component with the heater and for opening the shut-off valve to supply cooling medium to the first cooling flow passage of the base portion and the second cooling flow passage of the bonding tool, so that the base portion and the bonding tool are cooled.

4. The electronic component mounting apparatus according to claim 3, wherein the electronic component includes a bump formed on the electrode and the substrate includes a film of the bond metal formed on the electrode;

the control unit further comprising a contact detecting program for determining whether or not the bump and the film are in contact with each other based on a signal from the position detection unit; and a reference position setting program for setting the position of the bonding tool with respect to the substrate as the reference position when the contact detecting program determines that the bump and the film are in contact with each other.

5. The electronic component mounting apparatus according to claim 4, the control unit further comprising a second reference position setting program for setting the position of the bonding tool with respect to the substrate as a second reference position after the reference position setting program sets the reference position and when a distance of the bonding tool from the substrate on the path increases or decreases; and a second bonding tool position holding and cooling program for holding the position of the bonding tool on the path from the substrate based on the determination that the bond metal between the electrode of the electronic component and the electrode of the substrate is thermally fused when the bonding tool gets close to the substrate by a second predetermined distance from the second reference position while heating the electronic component and for opening the shut-off valve to supply cooling medium to the first cooling flow passage of the base portion and the second cooling flow passage of the bonding tool, so that the base portion and the bonding tool are cooled.

6. An electronic component mounting apparatus for mounting an electronic component on a substrate, the apparatus comprising:

a base portion comprising a base portion surface, the base portion being driven along a path toward and from the substrate;

a heater incorporated in the base portion;

a bonding tool comprising a first surface fixed in close contact to the base portion surface, a second surface opposite to the first surface, a pedestal formed on the second surface, the pedestal comprising a side surface, a retaining surface on which the electronic component is retained, and a second vacuum groove in the retaining surface, the second vacuum groove in fluid communication with a vacuum system to retain the electronic component by suction on the retaining surface, a first vacuum groove provided in the base portion, the first vacuum groove suctioning the bonding tool to the base portion;

a first cooling flow passage providing for cooling the base portion from an internal side of the base portion and that extends along the first surface inside the base portion;

a second cooling flow passage providing for cooling the bonding tool from an internal side of the bonding tool and that is communicated with between the first surface and the side surface of the pedestal;

a control unit for moving the bonding tool on the path and for opening and closing a shut-off valve with a drive unit;

wherein the control unit comprises a bonding tool position holding and cooling program for holding a position of the bonding tool on the path based on a determination that a thermally fusible bond metal between the electrode of the electronic component and the electrode of the substrate is thermally fused when the bonding tool gets close to the substrate by a predetermined distance from a reference position on the path while heating the electronic component with the heater and for opening the shut-off valve to supply cooling medium to the first cooling flow passage of the base portion and the second cooling flow passage of the bonding tool, so that the base portion and the bonding tool are cooled;

wherein the heater heats the bonding tool to thermally bond the electronic component retained on the retaining surface to the substrate; and wherein an electrode of the electronic component and an electrode of the substrate are bonded with the bond metal;

wherein the second cooling flow passage of the bonding tool at least partially allows cooling medium to flow therethrough along the retaining surface of the pedestal, and wherein the second cooling flow passage of the bonding tool is configured to include a cooling flow groove provided in the first surface and extending along the surface of the pedestal, one end of the cooling flow groove in communication with a cooling medium supply port and the other end of the cooling flow groove in communication with a cooling medium outlet provided on the side surface of the pedestal, and the surface of the base portion covering the cooling flow groove.

7. An electronic component mounting apparatus for mounting an electronic component on a substrate, the apparatus comprising:

a base portion comprising a base portion surface, the base portion being driven along a path toward and from the substrate;

a heater incorporated in the base portion;

a bonding tool comprising a first surface fixed in close contact to the base portion surface, a second surface opposite to the first surface, a pedestal formed on the second surface, the pedestal comprising
a side surface,
a retaining surface on which the electronic component is retained, and
a second vacuum groove in the retaining surface, the second vacuum groove in fluid communication with a vacuum system to retain the electronic component by suction on the retaining surface,
a first vacuum groove provided in the base portion, the first vacuum groove suctioning the bonding tool to the base portion;
a first cooling flow passage providing for cooling the base portion from an internal side of the base portion and that extends along the first surface inside the base portion;
a second cooling flow passage providing for cooling the bonding tool from an internal side of the bonding tool and that is communicated with between the first surface and the side surface of the pedestal;
a control unit for moving the bonding tool on the path and for opening and closing a shut-off valve with a drive unit;
wherein the control unit comprises a bonding tool position holding and cooling program for holding a position of the bonding tool on the path based on a determination that a thermally fusible bond metal between the electrode of the electronic component and the electrode of the substrate is thermally fused when the bonding tool gets close to the substrate by a predetermined distance from a reference position on the path while heating the electronic component with the heater and for opening the shut-off valve to supply cooling medium to the first cooling flow passage of the base portion and the second cooling flow passage of the bonding tool, so that the base portion and the bonding tool are cooled;
wherein the heater heats the bonding tool to thermally bond the electronic component retained on the retaining surface to the substrate; and
wherein an electrode of the electronic component and an electrode of the substrate are bonded with the bond metal;
wherein the base portion has a cooling medium supply passage including a cooling medium inlet provided on a base portion side surface through which cooling medium inflows and a cooling medium supply port provided on the base portion surface to which the bonding tool is fixed in close contact and configured to supply the cooling medium inflowing through the cooling medium inlet to the second cooling flow passage of the bonding tool.

8. The electronic component mounting apparatus according to claim 6, further comprising
a drive unit for driving the base portion along the path toward and from the substrate;
a position detection unit for detecting the position of the bonding tool on the path; and
a shut-off valve for opening and closing the first cooling flow passage of the base portion and the second cooling flow passage of the bonding tool.

9. The electronic component mounting apparatus according to claim 8, wherein
the electronic component includes a bump formed on the electrode and the substrate includes a film of the bond metal formed on the electrode;
the control unit further comprising
a contact detecting program for detecting whether or not the bump and the film are in contact with each other based on a signal from the position detection unit; and
a reference position setting program for setting the position of the bonding tool with respect to the substrate as the reference position when the contact detecting program determines that a bump and a film are in contact with each other.

10. The electronic component mounting apparatus according to claim 9, the control unit further comprising
a second reference position setting program for setting the position of the bonding tool with respect to the substrate as a second reference position after the reference position setting program sets the reference position and when a distance of the bonding tool from the substrate on the path increases or decreases; and
a second bonding tool position holding and cooling program for holding the position of the bonding tool on the path from the substrate based on the determination that the bond metal between the electrode of the electronic component and the electrode of the substrate is thermally fused when the bonding tool gets close to the substrate by a second predetermined distance from the second reference position while heating the electronic component and for opening the shut-off valve to supply cooling medium to the first cooling flow passage of the base portion and the second bonding tool, so that the base portion and the bonding tool are cooled.

11. An electronic component mounting apparatus for mounting an electronic component on a substrate, the apparatus comprising:
a base portion comprising a base portion surface, the base portion being driven along a path toward and from the substrate;
a heater incorporated in the base portion;
a bonding tool comprising
a first surface fixed in close contact to the base portion surface,
a second surface opposite to the first surface,
a pedestal formed on the second surface, the pedestal comprising
a side surface,
a retaining surface, and
a second vacuum groove recessed in the retaining surface, the second vacuum groove in fluid communication with a vacuum system to retain the electronic component by suction on the retaining surface, and
a first vacuum groove provided in the base portion, the first vacuum groove suctioning the bonding tool to the base portion;
a first cooling flow passage providing for cooling the base portion from an internal side of the base portion and that extends along the first surface inside the base portion; and
a second cooling flow passage providing for cooling the bonding tool from an internal side of the bonding tool and that is communicated with between the first surface and the side surface of the pedestal;
a control unit for moving the bonding tool on the path and for opening and closing a shut-off valve with the drive unit; the control unit comprising
a contact detecting program for detecting whether or not the bump and the film are in contact with each other based on a signal from the position detection unit; and a reference position setting program for setting the position of the bonding tool with respect to the substrate as the reference position when the contact detecting program determines that a bump and a film are in contact with each other;

wherein the heater heats the bonding tool to thermally bond the electronic component retained on the retaining surface to the substrate; and wherein an electrode of the electronic component and an electrode of the substrate are bonded with a thermally fusible bond metal;

wherein the second cooling flow passage of the bonding tool at least partially allows cooling medium to flow therethrough along the retaining surface of the pedestal, and wherein the second cooling flow passage of the bonding tool is configured to include a cooling flow groove provided in the first surface and extending along the surface of the pedestal, one end of the cooling flow groove in communication with a cooling medium supply port and the other end of the cooling flow groove in communication with a cooling medium outlet provided on the side surface of the pedestal, and the surface of the base portion covering the cooling flow groove.

12. An electronic component mounting apparatus for mounting an electronic component on a substrate, the apparatus comprising:
  a base portion comprising a base portion surface, the base portion being driven along a path toward and from the substrate;
  a heater incorporated in the base portion;
  a bonding tool comprising
    a first surface fixed in close contact to the base portion surface,
    a second surface opposite to the first surface,
    a pedestal formed on the second surface, the pedestal comprising
      a side surface,
      a retaining surface, and
      a second vacuum groove recessed in the retaining surface, the second vacuum groove in fluid communication with a vacuum system to retain the electronic component by suction on the retaining surface, and
    a first vacuum groove provided in the base portion, the first vacuum groove suctioning the bonding tool to the base portion;
    a first cooling flow passage providing for cooling the base portion from an internal side of the base portion and that extends along the first surface inside the base portion; and
    a second cooling flow passage providing for cooling the bonding tool from an internal side of the bonding tool and that is communicated with between the first surface and the side surface of the pedestal;
  a control unit for moving the bonding tool on the path and for opening and closing a shut-off valve with the drive unit; the control unit comprising
    a contact detecting program for detecting whether or not the bump and the film are in contact with each other based on a signal from the position detection unit; and
    a reference position setting program for setting the position of the bonding tool with respect to the substrate as the reference position when the contact detecting program determines that a bump and a film are in contact with each other;

wherein the heater heats the bonding tool to thermally bond the electronic component retained on the retaining surface to the substrate; and wherein an electrode of the electronic component and an electrode of the substrate are bonded with a thermally fusible bond metal;

wherein the base portion has a cooling medium supply passage including a cooling medium inlet provided on a base portion side surface through which cooling medium inflows and a cooling medium supply port provided on the base portion surface to which the bonding tool is fixed in close contact and configured to supply the cooling medium inflowing through the cooling medium inlet to the second cooling flow passage of the bonding tool.

13. The electronic component mounting apparatus according to claim 1, further comprising
  a drive unit for driving the base portion along the path toward and from the substrate;
  a position detection unit for detecting the position of the bonding tool on the path;
  a shut-off valve for opening and closing the first cooling flow passage of the base portion and the second cooling flow passage of the bonding tool; and
  a control unit for moving the bonding tool on the path and for opening and closing the shut-off valve with the drive unit;
  wherein a control unit comprises a bonding tool position holding and cooling program for holding a position of the bonding tool on the path based on a determination that the bond metal between the electrode of the electronic component and the electrode of the substrate is thermally fused when the bonding tool gets close to the substrate by a predetermined distance from a reference position on the path while heating the electronic component with the heater and for opening the shut-off valve to supply cooling medium to the first cooling flow passage of the base portion and the second bonding tool, so that the base portion and the bonding tool are cooled.

14. The electronic component mounting apparatus according to claim 13, wherein
  the electronic component includes a bump formed on the electrode and the substrate includes a film of the bond metal formed on the electrode.

15. The electronic component mounting apparatus according to claim 14, the control unit further comprising
  a second reference position setting program for setting the position of the bonding tool with respect to the substrate as a second reference position after the reference position setting program sets the reference position and when a distance of the bonding tool from the substrate on the path increases or decreases; and
  a second bonding tool position holding and cooling program for holding the position of the bonding tool on the path from the substrate based on the determination that the bond metal between the electrode of the electronic component and the electrode of the substrate is thermally fused when the bonding tool gets close to the substrate by a second predetermined distance from the second reference position while heating the electronic component and for opening the shut-off valve to supply cooling medium to the first cooling flow passage of the base portion and the second bonding tool, so that the base portion and the bonding tool are cooled.

* * * * *